US008665365B2

(12) United States Patent
Yamada

(10) Patent No.: US 8,665,365 B2
(45) Date of Patent: Mar. 4, 2014

(54) IMAGE-PICKUP APPARATUS

(75) Inventor: Motonari Yamada, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 51 days.

(21) Appl. No.: 13/549,886

(22) Filed: Jul. 16, 2012

(65) Prior Publication Data

US 2013/0021522 A1  Jan. 24, 2013

(30) Foreign Application Priority Data

Jul. 22, 2011  (JP) .................................. 2011-160880

(51) Int. Cl.
*H04N 5/225* (2006.01)
(52) U.S. Cl.
USPC .......................................... 348/374; 348/372
(58) Field of Classification Search
USPC ................................................ 348/372–374
See application file for complete search history.

(56) References Cited

U.S. PATENT DOCUMENTS 7,365,794 B2 * 4/2008 Yasui ............................ 348/374
7,952,613 B2 * 5/2011 Sekino et al. .............. 348/208.7
2008/0292308 A1 * 11/2008 Iwabuchi ...................... 396/535

FOREIGN PATENT DOCUMENTS

JP  2005-244709  9/2005
JP  2009-032765  2/2009

* cited by examiner

*Primary Examiner* — Gevell Selby
(74) *Attorney, Agent, or Firm* — Cowan, Liebowitz & Latman, P.C.

(57) ABSTRACT

An image-pickup apparatus includes an image-pickup element, a first wiring substrate where the image-pickup element is mounted, a second wiring substrate which is electrically connected with the first wiring substrate and a structure which has electrical conductivity. The first wiring substrate has a first wiring portion where a differential signal line is formed and a second wiring portion where a power-supply line is formed, a ground portion is formed on at least one surface of the first and second wiring portion which faces each other, the first wiring substrate is bended so that at least parts of the first and second wiring portion are overlapped with each other and the ground portion is located between the differential signal line and the power-supply line, and the bended first wiring substrate is arranged in the structure so that the second wiring portion is located between the first wiring portion and the structure.

20 Claims, 11 Drawing Sheets

IMAGE-PICKUP APPARATUS

BACKGROUND OF THE INVENTION

1. Field of the Invention

The present invention relates to a wiring for an image-pickup apparatus.

2. Description of the Related Art

Recently, the image-pickup apparatus such as digital cameras in which CCD and CMOS are assumed to be an image-pickup element has come to be used widely. A remarkable increase of a pixel count of CCD and CMOS in recent year leads to speed-up of driving frequency and increase of reading data size (See Japanese Patent Laid-Open No. 2009-032765). Therefore, Japanese Patent Laid-Open No. 2009-032765 discloses a LVDS (Low Voltage Differential Signaling) transmission system so as to transfer the data from the image-pickup element to the signal processing part. The LVDS transmission system attempts the speed-up of the transmission speed and the decrease in power consumption by using a differential signal with small amplitude which contradicts (differs in the polarity) mutually.

However, the number of wiring doubles compared with the systems other than the differential signal transmission system when the signal transmission system such as LVDS is adopted. Therefore, the area of the substrate which transmits by using the differential signal transmission system increases while the control signal of the image-pickup element increases, and the miniaturization of the main body of the digital camera is disturbed.

In addition, physical arrangement of grounded wiring and the signal line should be controlled so as to keep not only the differential mode impedance between two signal lines but also the common mode impedance within the predetermined range in the differential signal system. However, a lot of metallic parts which cause the disturbance of the impedance in the camera housing are arranged. Therefore, if the metallic parts come close the differential transmission signal, the impedance value is disturbed and the signal characteristic decreases.

SUMMARY OF THE INVENTION

The present invention provides an image-pickup apparatus that has a printed substrate which can reduce a projected area of a transmission substrate, and wire without disturbing an impedance of a differential signal in wiring for a substrate of a differential signal transmission system.

An image-pickup apparatus as one aspect of the present invention is an image-pickup apparatus includes an image-pickup element, a first wiring substrate where the image-pickup element is mounted, a second wiring substrate which is electrically connected with the first wiring substrate, and a structure which has electrical conductivity. The first wiring substrate has a first wiring portion and a second wiring portion, a differential signal line which transmits a differential signal between the image-pickup element and the second wiring substrate is formed on the first wiring portion, a power-supply line which transmits a power-supply signal between the image-pickup element and the second wiring substrate is formed on the second wiring portion, a ground portion is formed on at least one surface of the first wiring portion and the second wiring portion which faces each other, the first wiring substrate is bended so that at least parts of the first wiring portion and the second wiring portion are overlapped with each other and the ground portion is located between the differential signal line and the power-supply line, and the bended first wiring substrate is arranged in the structure so that the second wiring portion is located between the first wiring portion and the structure.

An image-pickup element as another aspect of the present invention includes a first wiring substrate where the image-pickup element is mounted, a second wiring substrate which is electrically connected with the first wiring substrate electrically and a structure which has electrical conductivity. The first wiring substrate has a first wiring portion and a second wiring portion, a differential signal line which transmits a differential signal between the image-pickup element and the second wiring substrate is formed on the first wiring portion, a non-differential signal line which transmits a non-differential signal between the image-pickup element and the second wiring substrate is formed on the second wiring portion, a ground portion is formed on at least one surface of the first wiring portion and the second wiring portion which faces each other, the first wiring substrate is bended so that at least parts of the first wiring portion and the second wiring portion are overlapped with each other and the ground portion is located between the differential signal line and the non-differential signal line, and the bended first wiring substrate is arranged in the structure so that the second wiring portion is located between the first wiring portion and the structure.

Further features and aspects of the present invention will become apparent from the following description of exemplary embodiments with reference to the attached drawings.

DESCRIPTION OF THE PREFERRED EMBODIMENTS

Figure 1:
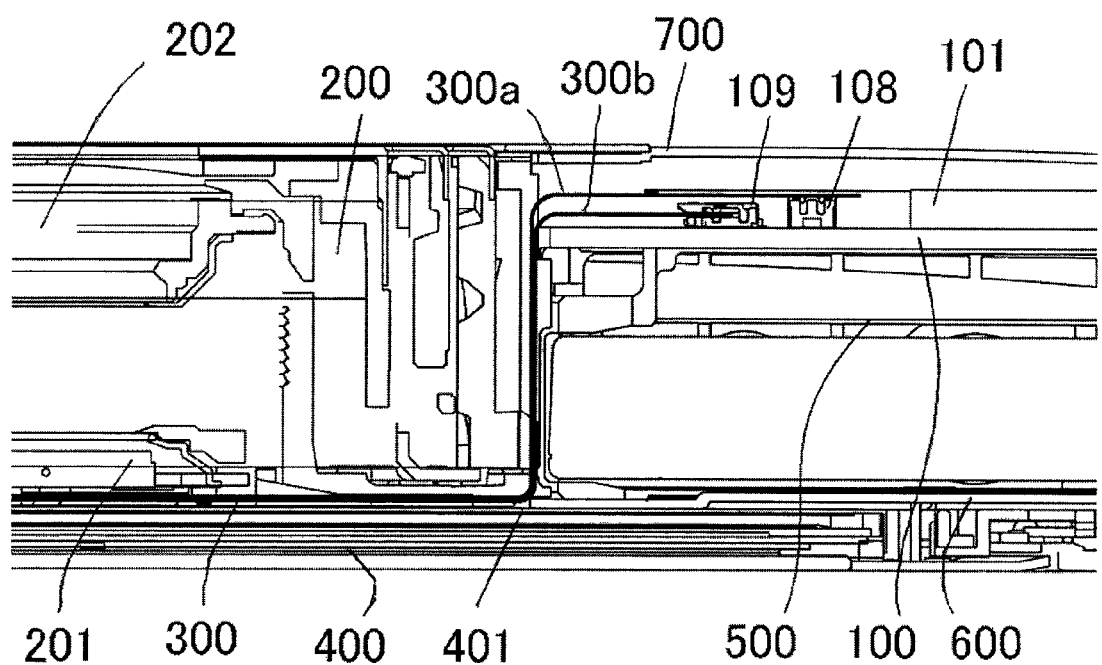
FIG. 1 is a cross-sectional view of an image-pickup apparatus of embodiment 1 applied to the present invention.

The embodiment of an image-pickup apparatus applied to the present invention referring to accompanying drawings. In each of the drawings, the same elements will be denoted by the same reference numerals and the duplicate descriptions thereof will be omitted.

[Embodiment 1]

Figure 3:
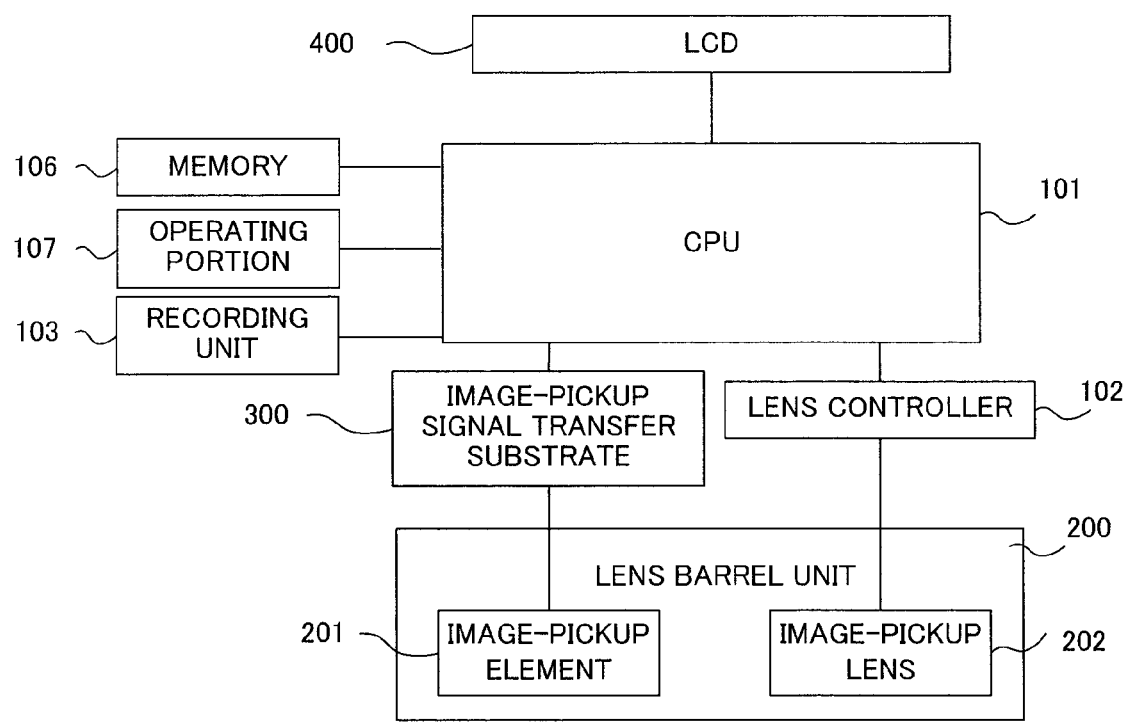
FIG. 3 is a block diagram of an image-pickup apparatus of embodiment 1 applied to the present invention.
Figure 4A:
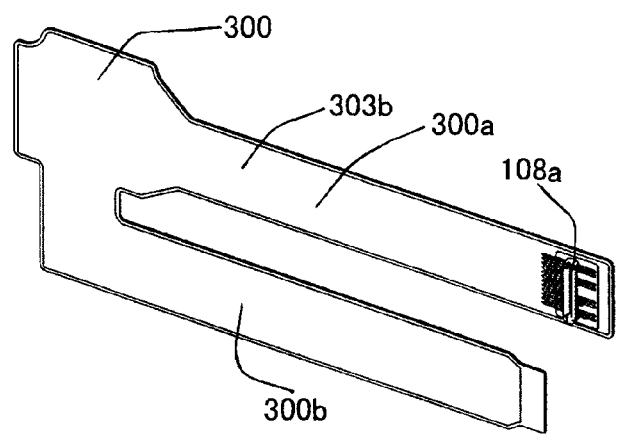
FIGS. 4A, 4B, 4C and 4D show a perspective view of an image-pickup signal transfer substrate of embodiment 1 applied to the present invention.
Figure 4B:
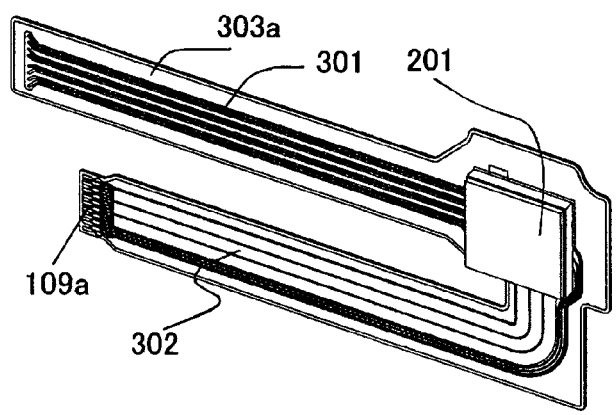
Figure 4C:
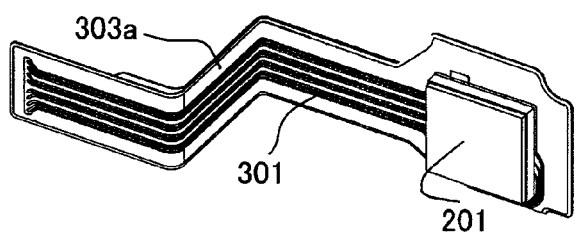
Figure 4D:
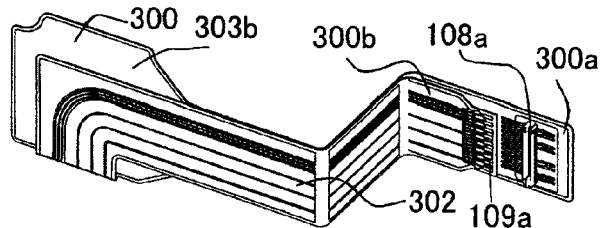

FIG. 3 is a block diagram of an image-pickup apparatus of embodiment 1 applied to the present invention.

A CPU (a signal processing IC) 101 which processes and controls various kinds of signals, and a lens controller 102 are mounted on a printed substrate (a second wiring substrate) 100 described later.

An image-pickup lens 202 is mounted on a lens barrel unit 200, which is driven by the lens controller 102 to form an image of an object on an image-pickup element 201. An image-pickup light is photoelectrically converted by the image-pickup element 201 into an electric signal, which passes through an image-pickup signal transfer substrate (a first wiring substrate) 300 and then are transferred to the CPU (the signal processing IC) 101 on the printed substrate 100. In other words, the printed substrate 100 is electrically connected to the image-pickup signal transfer substrate 300.

The CPU 101 drives the image-pickup element 201 via the image-pickup signal transfer substrate 300 to obtain data for which the photoelectric conversion has been performed, and outputs the data to a recording unit 103 as image data for which a signal processing has been performed. The recording unit 103 is not limited to a built-in memory, and includes external memories such as SD cards.

When taking a picture or reproducing, the image data is output from the CPU 101 to a LCD (a display unit) 400, and an image is displayed. Further, the CPU 101 is connected to a memory 106. The memory 106 stores a data such as configuration information by a user and an adjusted value at release, etc. which should be kept while the image-pickup apparatus turns off. The CPU 101 performs a kind of a control such as start of taking a picture and switching modes of shooting or reproduction according to operation of an operating portion 107.

Figure 2A:
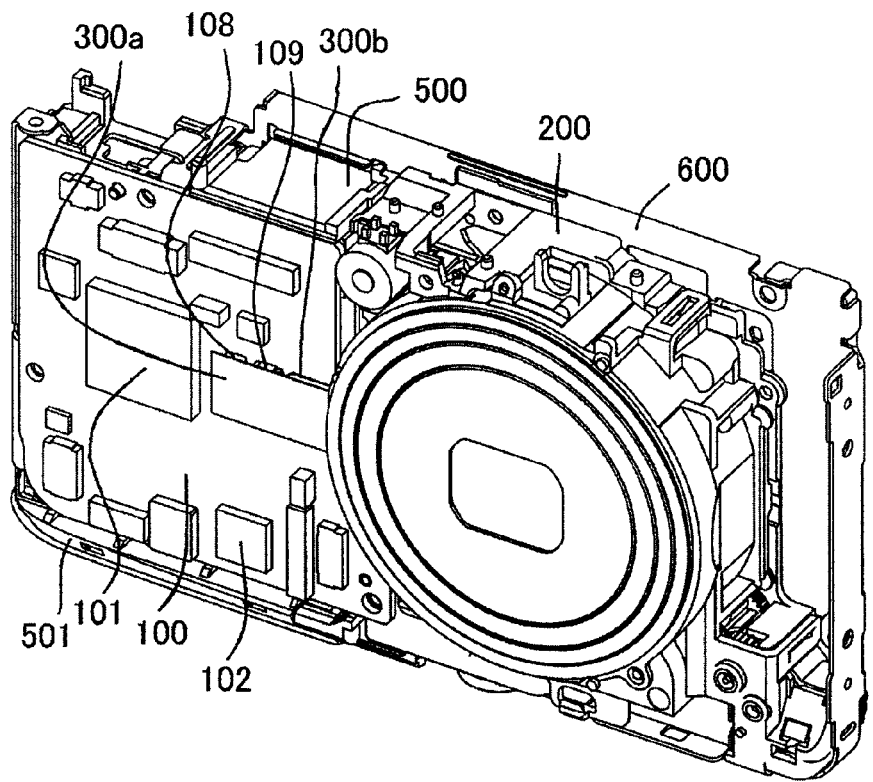
FIGS. 2A and 2B show a perspective view of an image-pickup apparatus of embodiment 1 applied to the present invention.
Figure 2B:
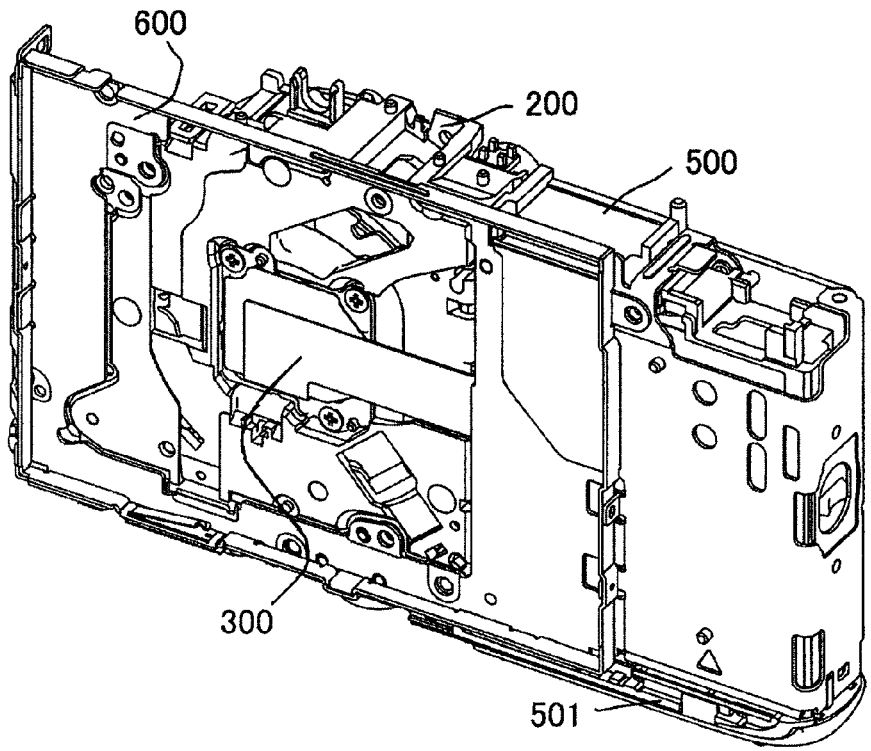

FIGS. 2A and 2B show a perspective view which shows basic structure of the image-pickup apparatus of the present invention.

FIGS. 2A and 2B show the image-pickup apparatus in the state where the image-pickup apparatus removes covers such as a front cover and a back cover, a top cover which is attached release buttons and main switches, and units such as a LCD unit as a display and a flash unit as a fill light.

FIG. 2A is a perspective view from the point of view of a front direction, and FIG. 2B is a perspective view from the point of view of a back direction. The image-pickup apparatus is assembled by attachment of parts on a main chassis 600.

A battery case (a battery storage room) 500 is attached with a screw at the left side of the main chassis 600 in FIG. 2A. An opening not shown in the figure is formed on the undersurface of the battery case 500, and a battery which supplies power from the opening is put in a battery storage portion. A battery case lid 501 so as to close or open the opening is attached to the opening.

After the battery case 500 is attached, the lens barrel unit 200 is attached at the right side of the main chassis 600. The image-pickup signal transfer substrate 300 is attached at the back side of the lens barrel unit 200 through a fixed plate.

FIGS. 4A, 4B, 4C and 4D show a perspective view of the image-pickup signal transfer substrate 300 of the present invention. The image-pickup signal transfer substrate 300 can wire both surfaces, and is long and thin multilayered printed substrate which divides into two. A flexible substrate is used for the image-pickup signal transfer substrate 300 in this embodiment. Additionally, a rigid flexible substrate having a part which has flexuous similar to the flexible substrate can be used for the image-pickup signal transfer substrate 300. When the image-pickup signal transfer substrate 300 is attached to the lens barrel unit 200, the image-pickup signal transfer substrate 300 is folded so as to overlap a first route (a first wiring portion) 300a and a second route (a second wiring portion) 300b.

The image-pickup element 201 which is bonded to the fixed plate is soldered with one end of the image-pickup signal transfer substrate 300. A male type B to B connector 108a and a flexible terminal area 109a which is inserted in a FPC connector 109 are formed on the other end of the image-pickup signal transfer substrate 300. And, the image-pickup signal transfer substrate 300 is creased in advance as so as to overlap the first route 300a and the second route 300b.

Figure 5A:
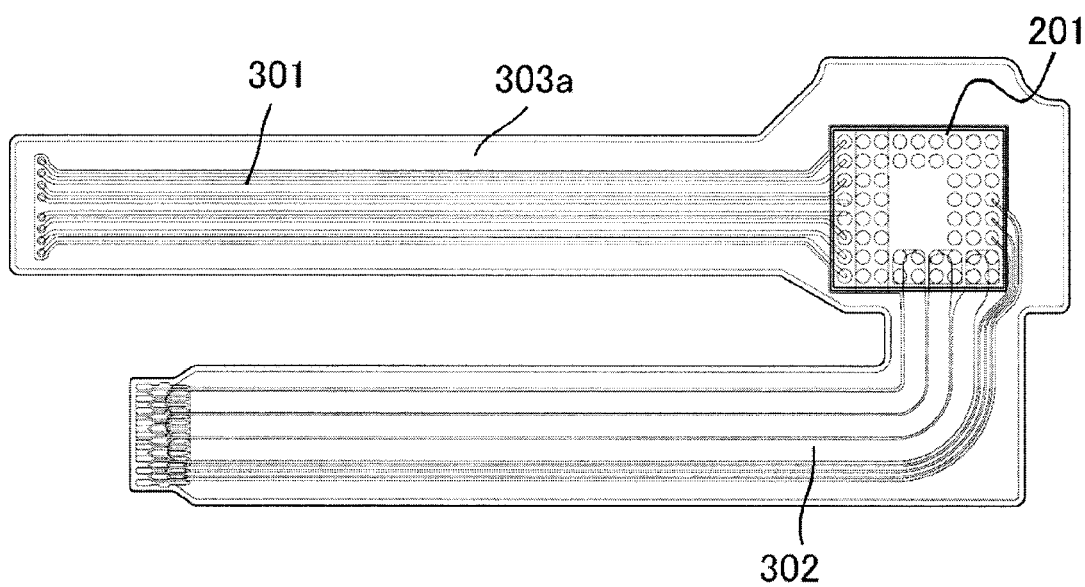
FIGS. 5A and 5B show a pattern chart of an image-pickup signal transfer substrate of embodiment 1 applied to the present invention.
Figure 5B:
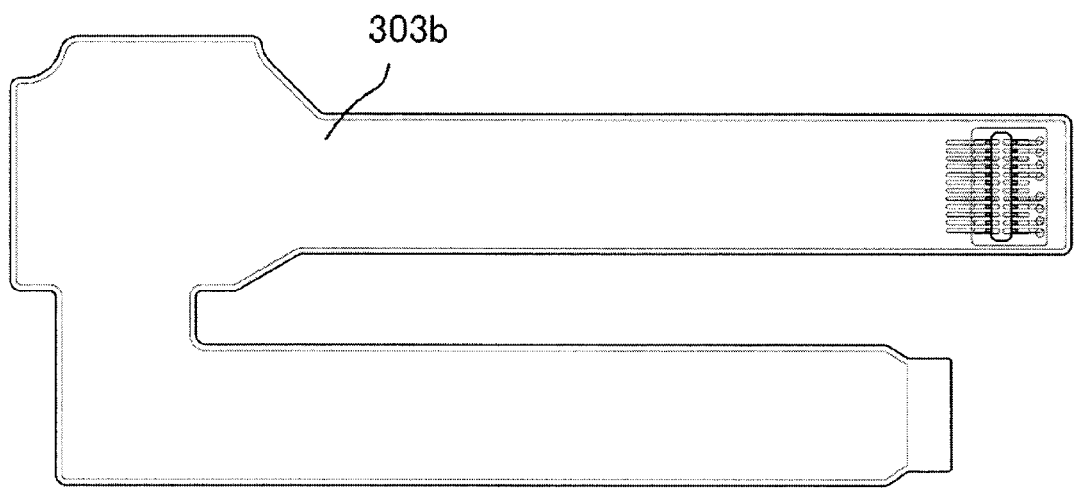

FIGS. 5A and 5B show a pattern chart of the image-pickup signal transfer substrate 300 applied to the present invention. A LVDS signal pattern (a differential signal line) 301 which transmits data photoelectrically converted by the image-pickup element 201, and a ground pattern 303a which connects with the LVDS signal pattern 301 are formed in the first route 300a. Moreover, a ground pattern (a ground portion) 303b is formed on the other side of the layer where the LVDS signal pattern 301 is wired. A power-supply line 302 of the image-pickup element 201 is formed on the second route 300b, and the second route 300b does not include the LVDS signal pattern 301. Moreover, not only the power-supply line 302 but also a non-differential signal line which transmits a non-differential signal such as an output line from a sensor etc. might be formed on the second route 300b. Thus, the impedance value of the LVDS signal pattern 301 in the image-pickup signal transfer substrate 300 could be easily managed by dividing the route of the LVDS signal pattern 301 and the power-supply line 302.

At this time, the ground patterns are mutually adjacent in the part where the first route 300a and the second route 300b are overlapped. As a result, the projected area of the image-pickup signal transfer substrate 300 can be reduced. Further, the wiring for the LVDS does not influence other signals such as a power-supply signal since the ground patterns are mutually adjacent.

As shown in FIGS. 2A and 2B, the printed substrate 100 is attached to the main chassis 600 so that a B to B connector (a first joint) 108 and the flexible terminal area 109a come before the printed substrate 100, and the printed substrate 100 and the main chassis 600 clip the battery case 500 after assembling the lens barrel unit 200. The CPU 101 which processes and controls various signals, a lens controller 102 which controls the lens barrel unit 200, female type B to B connector 108b and a FPC connector (a second joint) 109 are mounted on the printed substrate 100.

After assembling the printed substrate 100, the FPC connector 109 is fixed to the flexible terminal area 109a. Next, the male type B to B connector 108a is inserted in the female type B to B connector 108b.

Later, a LCD 400 kept to a LCD holding plate (a holding member) 401 is located on the back side of the main chassis 600.

After the units such as the flash unit as a fill light, the covers such as the front cover and the back cover, and the top cover which is attached the release buttons and the main switches are attached, the image-pickup apparatus is completed.

FIG. 1 is a cross-sectional view of the image-pickup apparatus in a finished state of the present invention including the main parts of image-pickup signal transfer substrate 300 such as the image-pickup element 201, the B to B connector 108, and the FPC connector 109.

As shown in Fig.1, the second route 300b which does not include the LVDS signal pattern 301 is arranged between the first route 300a including the LVDS signal pattern 301 and the LCD holding plate 401. At this time, the disturbance of the impedance value of the LVDS signal pattern 301 by lessening the distance between the first route 300a and the LCD holding plate 401 is prevented since the ground pattern 303b is clipped between the first route 300a and the LCD holding plate 401. The ground pattern 303b is formed on both of the first route 300a and the second route 300b in this embodiment. However, if the ground pattern 303b is formed on either of the first route 300a and the second route 300b, this configuration provides the same effect. Moreover, since the B to B connector 108 and the FPC connector 109 have different height, the first route 300a and the second route 300b can be connected so as to overlap seeing from the front side of the image-pickup apparatus. In addition, the disturbance of the impedance value can be prevented immediately before each connector connects since the B to B connector 108 and the FPC connector 109 can be arranged in the short distance.

The LCD holding plate 401 is assumed as a structure having conductive property in this embodiment. In addition, the impedance value of the structure having conductive property such as a chassis can be reduced. Since signals having high frequency components shuttle in the LVDS signal pattern 301, it is desirable that the LVDS signal pattern 301 is designed as short as possible so as to reduce a radiation of a radio wave.

Figure 6:
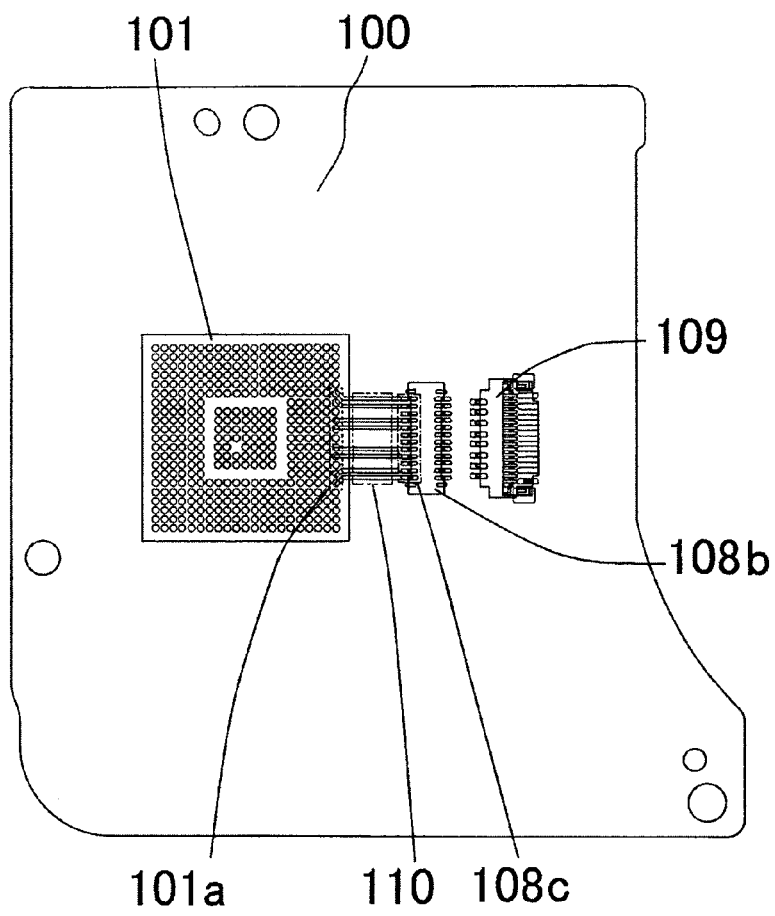
FIG. 6 is a pattern chart of a printed substrate of embodiment 1 applied to the present invention.

FIG. 6 is a pattern chart of the printed substrate 100 of the present invention. The B to B connector 108 is mounted near the CPU 101 on the printed substrate 100. A terminal 108c which is the CPU 101 side of the B to B connector 108, and a terminal 101a which is the B to B connector 108 of the CPU 101 are allocated the signal connected with the LVDS signal pattern 301. A LVDS signal pattern (a differential signal wiring pattern) 100 is formed so as to transmit the data from the image-pickup element 201 along on the surface of the printed substrate 100 from the terminal 108c to the terminal 101a.

The above configuration can protect the differential signal which causes the disturbance of the impedance value, and reduce the differential signal transmission path. Additionally, the image-pickup apparatus is prevented being enlarged since the image-pickup signal transfer which is folded doubly is arranged in a narrow cutout portion between the lens barrel and the battery storage room so as to pass a lot of signals to the narrow space.

[Embodiment 2]

Figure 7:
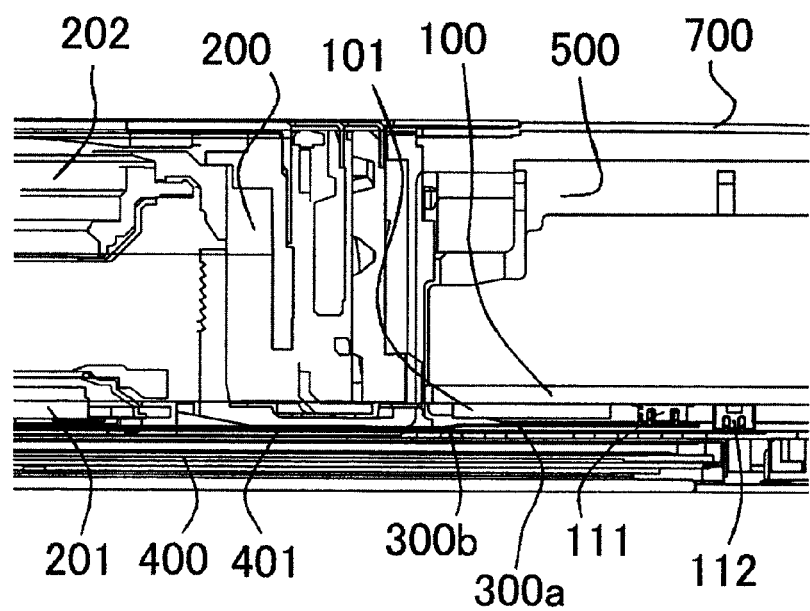
FIG. 7 is a cross-sectional view of an image-pickup apparatus of embodiment 2 applied to the present invention.
Figure 8:
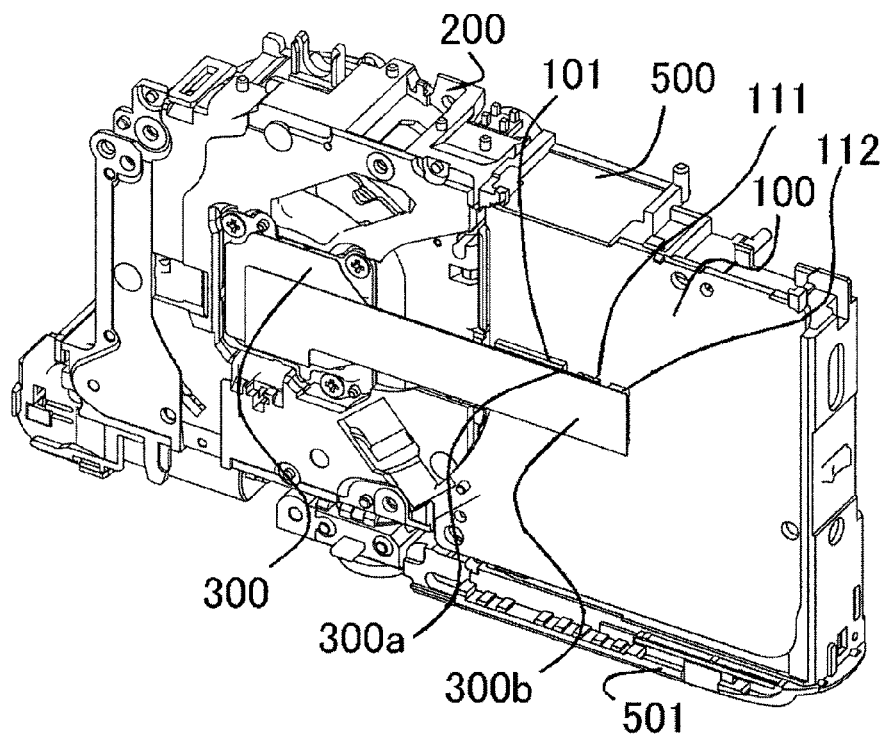
FIG. 8 is a perspective view of an image-pickup apparatus of embodiment 2 applied to the present invention.

Though the printed substrate 100 is arranged on the front side of the battery case 500 in embodiment 1, the printed substrate 100 may be arranged on the back side of the battery case 500. FIG. 7 is a cross-sectional view of the image-pickup apparatus of this embodiment, and FIG. 8 is a perspective view of the image-pickup apparatus of this embodiment.

The printed substrate 100 is arranged on the back side of the battery case 500 in the image-pickup apparatus of this embodiment. The image-pickup signal transfer substrate 300 is folded so as to overlap the first route 300a and the second route 300b, and is connected with the printed substrate 100 with the flexible terminal areas which insert in the B to B connector 111 and the FPC connector 112 with different height of the B to B connector 111. Since the wiring length of the LVDS signal pattern 301 in the image-pickup signal transfer substrate 300 can be shortened by arranging the printed substrate 100 on the back side of the battery case 500, an unnecessary radiation can be suppressed.

[Embodiment 3]

Figure 9:
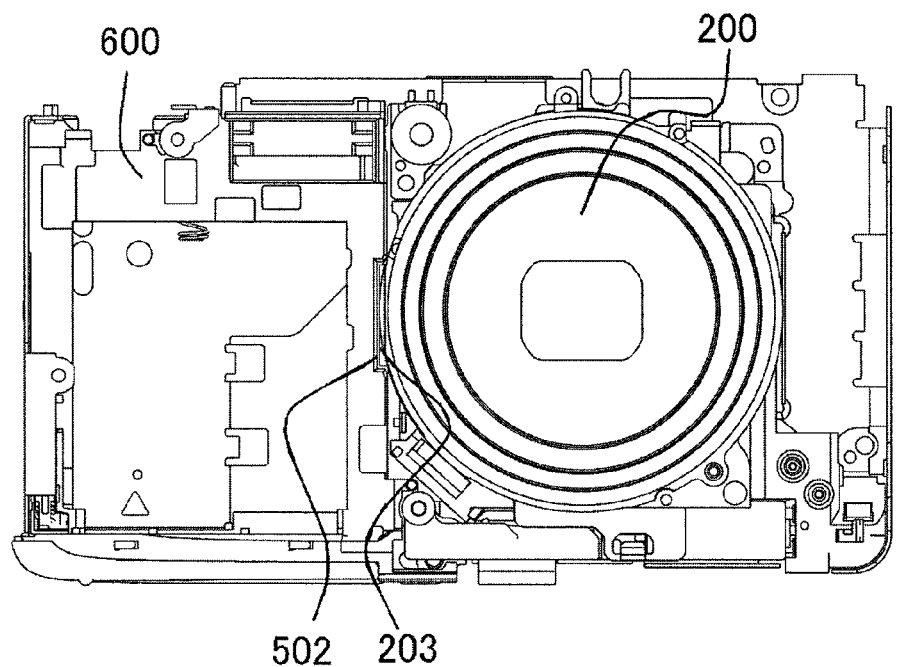
FIG. 9 is a front view of an image-pickup apparatus of embodiment 3 applied to the present invention.
Figure 10:
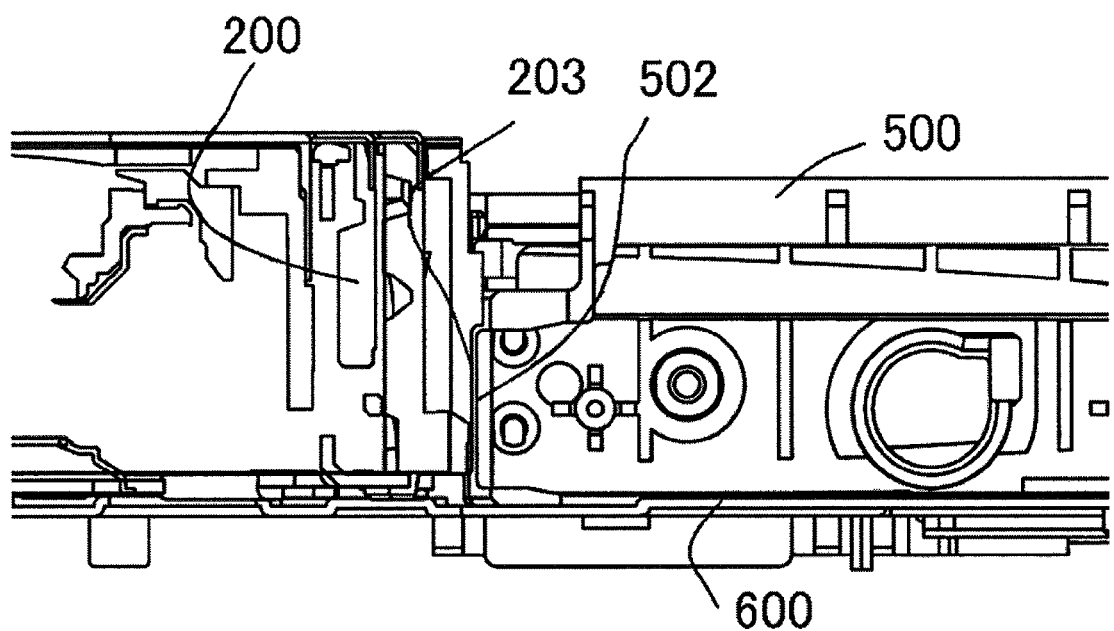
FIG. 10 is a cross-sectional view of an image-pickup apparatus of embodiment 3 applied to the present invention.
Figure 11A:
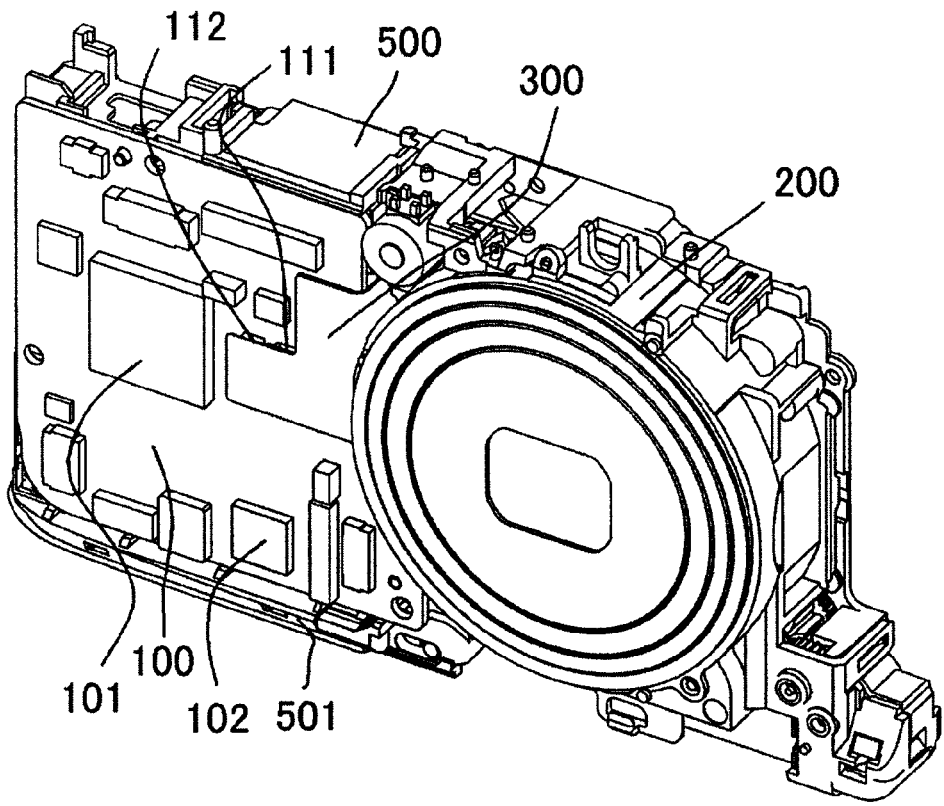
FIGS. 11A and 11B show a perspective view of an image-pickup apparatus, a lens barrel unit and an image-pickup signal transfer substrate of embodiment 3 applied to the present invention.
Figure 11B:
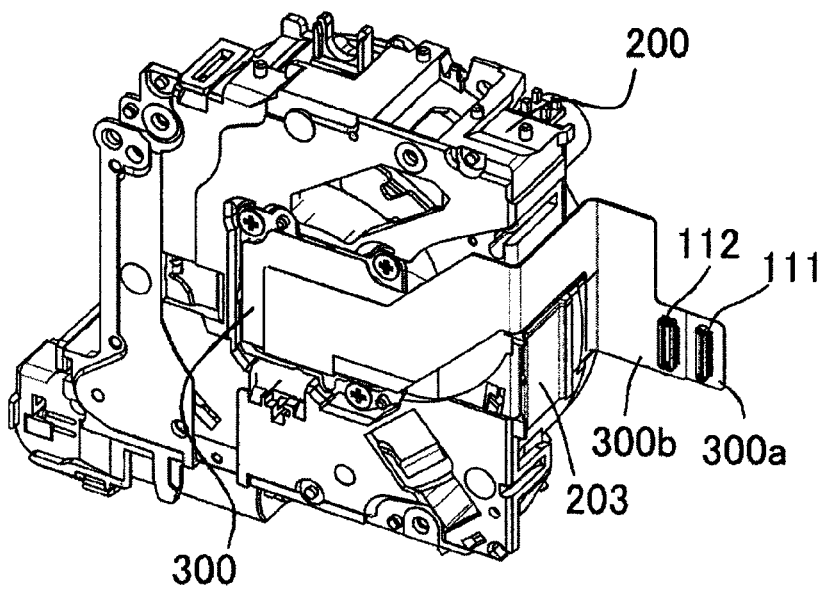
Figure 12A:
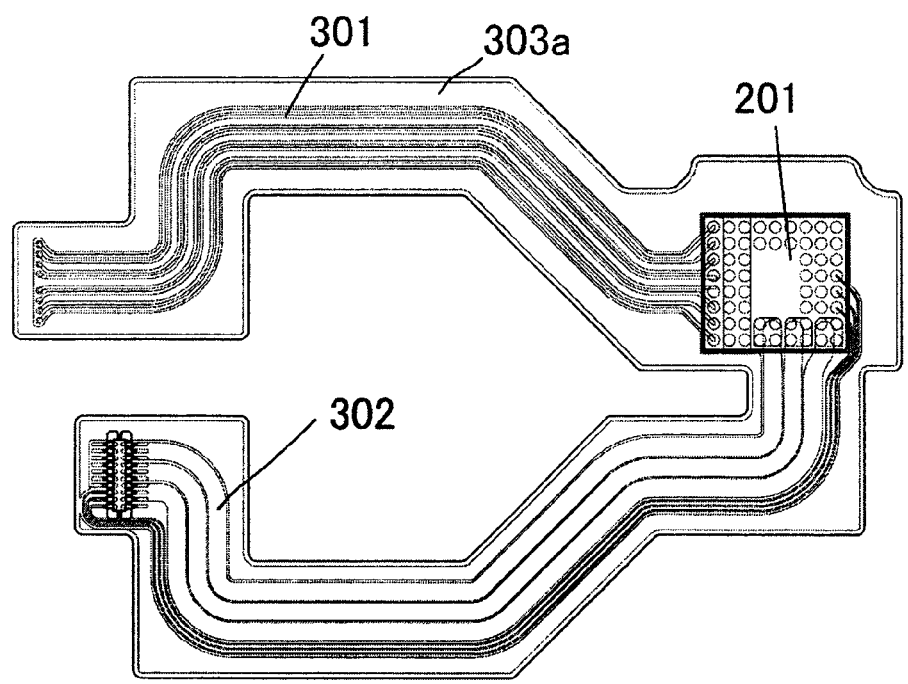
FIGS. 12A and 12B show a pattern chart of an image-pickup signal transfer substrate of embodiment 3 applied to the present invention.
Figure 12B:
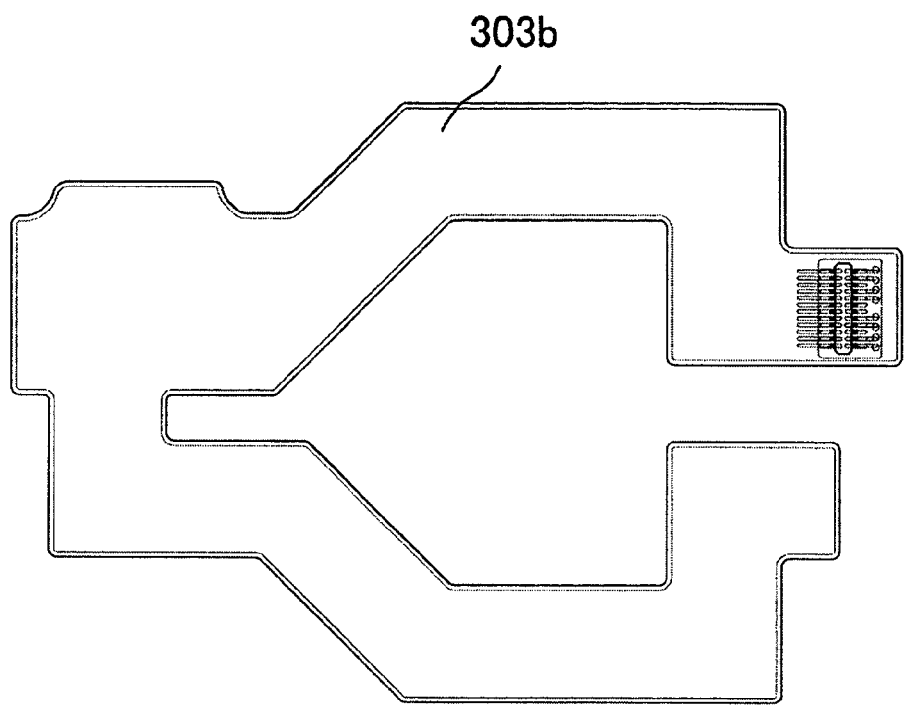
Figure 13A:
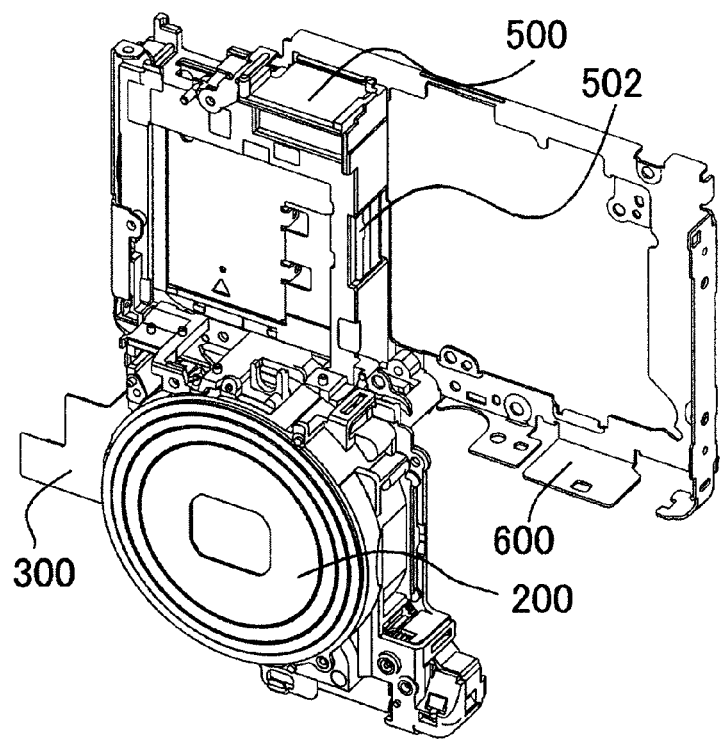
FIGS. 13A and 13B show an exploded perspective view of an image-pickup apparatus of embodiment 3 applied to the present invention.
Figure 13B:
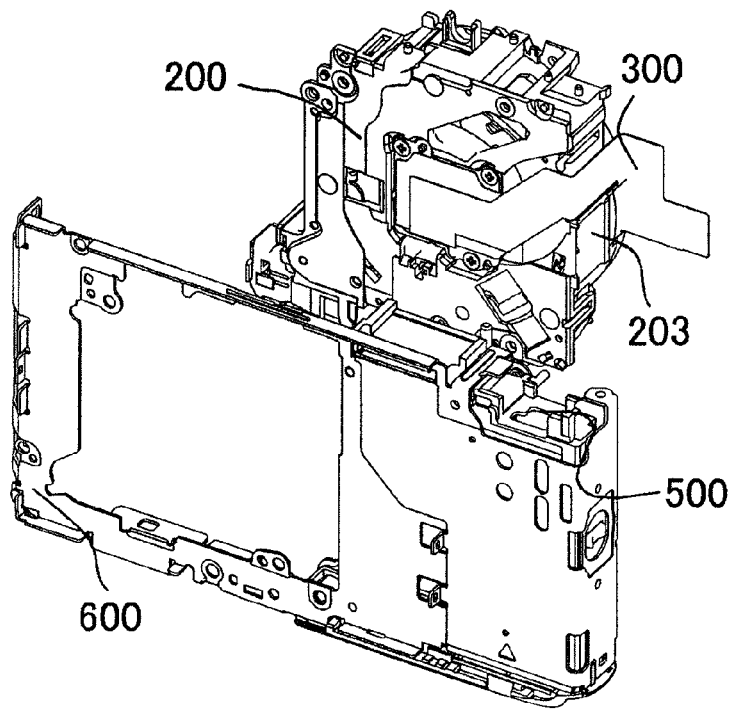

FIG. 9 is a front view of the image-pickup apparatus of this embodiment. FIG. 10 is a cross-sectional view of the image-pickup apparatus of this embodiment. FIGS. 11A and 11B show a perspective view of the image-pickup apparatus, the lens barrel unit 200, and the image-pickup signal transfer substrate 300 of this embodiment. FIGS. 12A and 12B show a pattern chart of the image-pickup signal transfer substrate 300 of this embodiment. FIG. 12A shows a surface where the image-pickup element 201 is mounted, and the LVDS signal pattern 301 is wired. FIG. 12B shows a surface where the ground line 303b is wired. FIGS. 13A and 13B show an exploded perspective view of the image-pickup apparatus of this embodiment. FIG. 13A is a perspective view on the front side of the image-pickup apparatus, and FIG. 13B is a perspective view on back side of the image-pickup apparatus.

In the image-pickup apparatus of this embodiment, a cutout portion 502 is formed on the part of the inner wall where the battery of the battery case 500 is stored. Additionally, an outside diameter part 203 of the lens barrel unit 200 is formed so as to set in the cutout portion 502. Since the outside diameter part 203 of the lens barrel unit 200 double with the inner wall of the battery case 500, the main body of the image-pickup apparatus can be miniaturized. At this time, as shown in FIG. 11B, the image-pickup signal transfer substrate 300 need to avoid the cut out portion 502 which is the outside diameter part 203 of the lens barrel unit 200, and to wire through a cutout portion which differs from the cutout portion 502 between the lens barrel unit 200 and the battery case 500. A lot of signals can be pass in the space of narrow width in the limited space from the outside diameter 203 of the lens barrel body which doubles the inner wall of the battery case 500 to the upper part of the main body of the image-pickup apparatus since the route of the image-pickup signal transfer substrate 300 which is folded the divided routes is wired as shown in FIGS. 12A and 12B.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-160880, filed on Jul. 22, 2011, which is hereby incorporated by reference herein in its entirety.

What is claimed is:

1. An image-pickup apparatus comprising:
   an image-pickup element;
   a first wiring substrate where the image-pickup element is mounted;
   a second wiring substrate which is electrically connected with the first wiring substrate; and
   a structure which has electrical conductivity,
   wherein the first wiring substrate has a first wiring portion and a second wiring portion,
   wherein a differential signal line which transmits a differential signal between the image-pickup element and the second wiring substrate is formed on the first wiring portion,
   wherein a power-supply line which transmits a power-supply signal between the image-pickup element and the second wiring substrate is formed on the second wiring portion,
   wherein a ground portion is formed on at least one surface of the first wiring portion and the second wiring portion which face each other, wherein the first wiring substrate is bended so that at least parts of the first wiring portion and the second wiring portion are overlapped with each other and the ground portion is located between the differential signal line and the power-supply line, and wherein the bended first wiring substrate is arranged in the structure so that the second wiring portion is located between the first wiring portion and the structure.

2. The image-pickup apparatus according to claim 1, wherein the first wiring substrate is one of a flexible substrate and a rigid flexible substrate.

3. The image-pickup apparatus according to claim 1, wherein the structure is a holding member of a display unit.

4. The image-pickup apparatus according to claim 1, wherein the first wiring substrate is bended by folding the second wiring portion.

5. The image-pickup apparatus according to claim 1, wherein the first wiring substrate has a multilayered structure.

6. The image-pickup apparatus according to claim 1, further comprising:
a lens barrel unit where the image-pickup element is fixed; and
a battery storage room which is adjacent to the lens barrel unit and configured to store a battery that supplies power,
wherein a cutout portion is formed on the battery storage room,
wherein a part of the lens barrel unit forms a part of an inner wall of the battery storage room by being fitted into the cutout portion, and
wherein the first wiring substrate is arranged so as to avoid the cutout portion.

7. The image-pickup apparatus according to claim 1,
wherein the first wiring portion is connected with the second wiring substrate at a first joint,
wherein the second wiring portion is connected with the second wiring substrate at a second joint, and
wherein the first joint and the second joint are formed at positions different from each other on the second wiring substrate.

8. The image-pickup apparatus according to claim 7,
wherein a signal processing IC which processes a signal outputted from the image-pickup element is mounted on the second wiring substrate, and
wherein the signal processing IC is formed so as to be closer to the first joint than the second joint.

9. The image-pickup apparatus according to claim 8, wherein a differential signal wiring pattern which connects between the first joint and the signal processing IC is formed on a surface layer of the second wiring substrate.

10. The image-pickup apparatus according to claim 1, wherein the differential signal is a differential signal of a LVDS transmission system.

11. An image-pickup apparatus comprising:
an image-pickup element;
a first wiring substrate where the image-pickup element is mounted;
a second wiring substrate which is electrically connected with the first wiring substrate electrically; and
a structure which has electrical conductivity,
wherein the first wiring substrate has a first wiring portion and a second wiring portion,
wherein a differential signal line which transmits a differential signal between the image-pickup element and the second wiring substrate is formed on the first wiring portion,
wherein a non-differential signal line which transmits a non-differential signal between the image-pickup element and the second wiring substrate is formed on the second wiring portion,
wherein a ground portion is formed on at least one surface of the first wiring portion and the second wiring portion which faces each other,
wherein the first wiring substrate is bended so that at least parts of the first wiring portion and the second wiring portion are overlapped with each other and the ground portion is located between the differential signal line and the non-differential signal line, and
wherein the bended first wiring substrate is arranged in the structure so that the second wiring portion is located between the first wiring portion and the structure.

12. The image-pickup apparatus according to claim 11, wherein the first wiring substrate is one of a flexible substrate and a rigid flexible substrate.

13. The image-pickup apparatus according to claim 11, wherein the structure is a holding member of a display unit.

14. The image-pickup apparatus according to claim 11, wherein the first wiring substrate is bended by folding the second wiring portion.

15. The image-pickup apparatus according to claim 11, wherein the first wiring substrate has a multilayered structure.

16. The image-pickup apparatus according to claim 11, further comprising:
a lens barrel unit where the image-pickup element is fixed; and
a battery storage room which is adjacent to the lens barrel unit and configured to store a battery that supplies power,
wherein a cutout portion is formed on the battery storage room,
wherein a part of the lens barrel unit forms a part of an inner wall of the battery storage room by being fitted into the cutout portion, and
wherein the first wiring substrate is arranged so as to avoid the cutout portion.

17. The image-pickup apparatus according to claim 11,
wherein the first wiring portion is connected with the second wiring substrate at a first joint,
wherein the second wiring portion is connected with the second wiring substrate at a second joint, and
wherein the first joint and the second joint are formed at positions different from each other on the second wiring substrate.

18. The image-pickup apparatus according to claim 17,
wherein a signal processing IC which processes a signal outputted from the image-pickup element is mounted on the second wiring substrate, and
wherein the signal processing IC is formed so as to be closer to the first joint than the second joint.

19. The image-pickup apparatus according to claim 18, wherein a differential signal wiring pattern which connects between the first joint and the signal processing IC is formed on a surface layer of the second wiring substrate.

20. The image-pickup apparatus according to claim 11, wherein the differential signal is a differential signal of a LVDS transmission system.

* * * * *